United States Patent [19]

Suplinskas et al.

[11] Patent Number: 4,628,002
[45] Date of Patent: Dec. 9, 1986

[54] SILICON CARBIDE MONOFILAMENT FOR TRANSVERSE COMPOSITE PROPERTIES

[75] Inventors: Raymond J. Suplinskas, Haverhill; Thomas W. Henze, Lawrence, both of Mass.; James V. Marzik, Nashua, N.H.

[73] Assignee: Avco Corporation, Lowell, Mass.

[21] Appl. No.: 738,614

[22] Filed: May 28, 1985

[51] Int. Cl.$^4$ ............................ D02G 3/00; B32B 9/00
[52] U.S. Cl. ................................... 428/367; 427/249; 428/368; 428/375
[58] Field of Search ............... 428/367, 391, 375, 368, 428/373, 446; 427/228, 249, 344

[56] References Cited

U.S. PATENT DOCUMENTS

| | | | |
|---|---|---|---|
| 3,622,369 | 11/1971 | Basche et al. | 427/249 X |
| 3,658,680 | 4/1972 | Combe et al. | 427/249 X |
| 4,068,037 | 1/1978 | Debolt | 427/249 X |
| 4,131,697 | 12/1978 | Randon et al. | 427/249 |
| 4,315,968 | 2/1982 | Suplinskas et al. | 428/367 |
| 4,340,636 | 7/1982 | Debolt et al. | 427/249 X |

Primary Examiner—Lorraine T. Kendell
Attorney, Agent, or Firm—Abraham Ogman

[57] ABSTRACT

This invention is directed to a surface treatment for SiC monofilament developed for the purpose of increasing the transverse strain-to-failure of composites, particularly aluminum composites. The surface treatment includes a fine grain SiC region adjacent to the bulk or stoichiometric SiC region and a transition region which interacts with the matrix material.

10 Claims, 3 Drawing Figures

SILICON CARBIDE MONOFILAMENT FOR TRANSVERSE COMPOSITE PROPERTIES

BACKGROUND OF THE INVENTION

The invention is grounded in the art of high-strength, high-modulus silicon carbide (SiC) monofilaments. Typically, these monofilaments exhibit tensile strengths in excess of 300,000 pounds per square inch (psi) and bending or Young's modulus in excess of 30 million psi.

The heretofore baseline SiC monofilament has a tensile strength of 350-400 thousand psi and a bending modulus of $55-60 \times 10^6$ psi.

The field of technology defined as high-strength, high-modulus monofilaments is unique and ultracritical to changes in structure or process of manufacture.

Persons skilled in the art of high-strength, high-modulus filaments have observed that it is frequently not possible to predict what effect changes in compositions, processes, feedstocks, or post-treatments will have on the properties of this unique family of filaments.

Boron nitride, boron carbide, titanium nitride, titanium carbide, and tungsten in combination with boron or silicon carbide filaments have failed to provide a useful filament, though in each instance, the candidate material was chosen to enhance one or more properties of the high-strength filament.

A silicon carbide coating on a silicon carbide filament would not protect the filament from degradation unless the coating had a critical cross-section profile. See U.S. Pat. Nos. 4,340,636 and 4,415,609.

Carbon cores require buffer layers deposited at critical specific temperatures. See U.S. Pat. No. 4,142,008.

Carbon-rich silicon carbide outer layers which create and protect high tensile strengths or silicon carbide filaments were found to form ineffective metal matrix and resin matrix composite materials. See U.S. Pat. Nos. 4,340,636 and 4,415,609.

Recrystallization of fine grain structures occurs at one temperature. After 5 seconds of exposure to the temperature, the filament loses 50 percent of its strength. Exposure to a temperature in the order of 2 percent lower shows no subsequent degradation.

Critical crystal morphology of a carbon-rich region in a silicon carbide filament was found to improve machinability of silicon carbide reinforced composites. The proper claim structure was the difference between a commercially-viable monofilament and trash.

Other structural or manufacturing procedural features which were found to be of a critical nature are change in core composition and surface texture, the presence or absence of a buffer layer of specific compositions, impurities, and reactivity of a surface coating with matrix material.

SiC Monofilaments

The basic SiC monofilament comprises a core, generally carbon or tungsten, about 0.5 to 1.5 mils in diameter on which a thick stoichiometric $\beta$ SiC coating of 2-4 mils thick is deposited. This stoichiometric coating is commonly called the bulk layer or bulk SiC.

To improve or tailor properties, intermediate layers and surface treatments in many forms have been tried and used. U.S. Pat. No. 4,340,636 referred to previously depicts what is considered the baseline commercial SiC monofilament commonly called SCS-2 monofilament. It contains a carbon-rich intermediate buffer layer between the core and bulk layer.

Statement of Invention

The invention comprises a unique and critical surface treatment for SiC monofilament. There is deposited on the bulk SiC a thin layer of fine grain SiC. For purposes of this invention the term "fine grain SiC" shall apply to polycrystalline SiC crystals with diameters of less than 50-100 nanometers ($10^{-9}$ meters) and a length of less than 1 micron. In contrast, the bulk SiC has a grain size of 500-1,000 nanometers and a length averaging several microns long. A ratio of at least 10/1 is typical.

On top of the fine grain SiC, there is transition zone. In one configuration of transition zone, the Si/C ratio decreases and then increases. Finally, the surface comprises essentially pure silicon. As will be described later, each zone of the surface treatment performs a unique and critical function necessary to achieve the improved transverse strain to failure ratio. Another transition zone may comprise boron carbide ($B_4C$).

Objectives

It is an object of the invention to provide a SiC monofilament structure which avoids the limitations and disadvantages of prior SiC monofilaments.

It is another object of the invention to provide a SiC monofilament structure which results in a higher composite transverse strain to failure ratio.

It is yet another object of the invention to use a layer of fine grain SiC between the bulk SiC and a transition zone which interacts with the matrix material.

It is still another object of the invention to provide a new surface to enhance wetting.

It is another object of the invention to provide a SiC monofilament for the manufacture of composites having a transverse strain to failure ratio in excess of 2500 micro inches per inch.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

DETAILED DESCRIPTION

Figure 1:
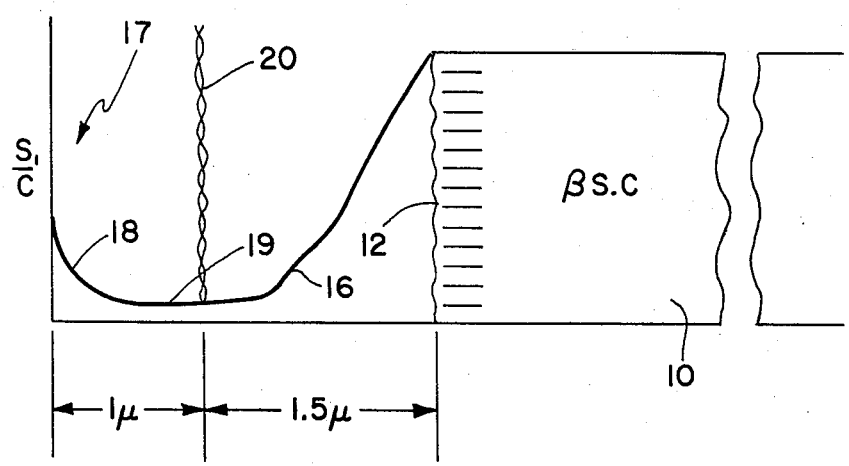
FIG. 1 is a representation of the composition of the surface region of the baseline SCS-2 monofilament as determined by scanning Auger microscopy.

Referring to FIG. 1, there is shown a diagram of an SCS-2 monofilament. The intermediate carbon-rich layer and core are not shown. The symbol 10 identifies the bulk SiC comprising $\beta$ SiC in stoichiometric proportions. The irregular vertical line 12 depicts the exterior boundary of the bulk SiC 10. The horizontal lines 14 are meant to depict surface flaws and irregularities of the bulk layer 10. A transition zone 17 sits over the bulk monofilament 10. The transition zone is designed to interact with the matrix material. Interaction means that the matrix will wet the monofilament or react with the transition zone to form a good bond, all without degrading the properties of the monofilament. Region 16 is a transition region where the Si/C ratio typically goes from 1 to zero. Region 18 shows another graded region where the Si/C ratio goes from zero to 0.3 or 0.5 typically. The region 19 is an essential pure carbon region.

Also typically, region 16 and part of region 19 have a thickness of 1.5 microns, and region 18 and the remaining portion of region 19 have a thickness of 1.0 microns.

Figure 2:
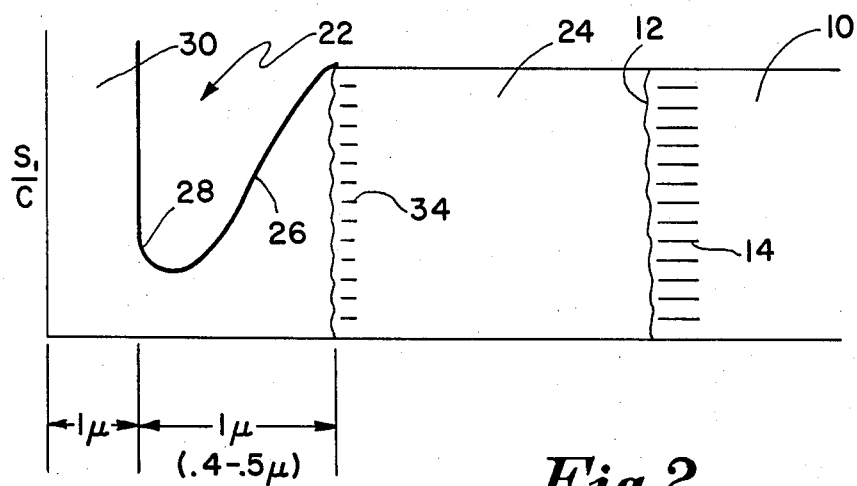
FIG. 2 is a representation of the composition and morphology of the structure comprising the present invention as determined by scanning Auger microscopy and scanning electron microscopy.

FIG. 2 shows a diagram which delineates one form of the inventive structure. The FIG. 2 monofilament includes a transition zone which is particularly suitable for aluminum matrices. Other transition zones, such as $B_4C$, may be used based on studies of the use of boronic surface coatings. See U.S. Pat. No. 4,340,636.

As before, 10 identifies the bulk $\beta$ SiC monofilament. The exterior boundary of the bulk SiC 10 is the line 12. The symbol 14 identifies the surface flaws. There is also a second transition zone 22. Disposed between the exterior boundary 12 and the second transition zone 22 is a fine grain SiC layer 24.

The transition zone 22 includes a region 26 where the Si/C ratio goes from 1 to 0.2–0.5 and region 28, where Si/C increases precipitously to an exterior surface 30 of essentially pure silicon.

It will be noted that the variation in C/Si is continuous and generally smooth.

The fine grain region is typically 6±25% microns thick. The total thickness of regions 26 and 28 is less than 1 micron but typically 0.4±25%. The silicon exterior has a thickness of 1.0 micron±50%.

It is also to be noted that thicknesses are critical.

It was empirically determined that the transverse failure occurred in the transition zone 17 in FIG. 1, and, in particular, in the region where the C/Si ratio was zero or close to zero. See line 20 in FIG. 1.

The structure of this zone has been shown by transmission electron microscopy to be composed of layers of carbon atoms with less than graphitic ordering within each layer. The interlayer strength of this material is quite low. Transverse composite failure initiated in this region results in part of the transition zone remaining bonded to the matrix and part remaining bonded to the base fiber; strain to failure was typically less than 1,000 micro inches per inch.

Referring to the transition zone 17 region, the transition region 16 provides strengthening by sealing over the exposed integranular flaws 14. The carbon region 19 inhibits the propagation of surface defects into the bulk monofilament. Region 18 provides a chemical composition which is wetted by the matrix, typically aluminum and titanium.

A corresponding representation of the inventive monofilament embodied in FIG. 2 is illustrated. The fine grain SiC region 24 performs part of the function of sealing over the integranular flaws 14 in FIG. 2. It has a much finer crystallite size than the bulk SiC 10 as previously disclosed. The intrinsic size of the integranular flaws are at 34. An increase in fiber tensile strength from 300,000 to 450–500 thousand psi accompanies the reduction in the size of the integranular flaws. Since the surface flaws to be sealed over are now much smaller, a thinner layer of carbonaceous matter suffices. This thinner layer does not have the layered, weak structure of zone 17 and hence is not the weak link when the composite is stressed perpendicular to the fibers. The regions 26 and 28 complete the sealing by depositing a layer of carbon over the fine grain SiC. The regions 26 plus 28 are rarely in excess of one micron but generally 0.4 to 0.5 micron.

Region 28 provides the transition back to the appropriate composition for wetting. Because of their thinness, the regions 26 and 28 do not provide a flaw-arresting function.

Surface flaws take the form of small, typically 0.05 micron, aluminum carbide or titanium carbide crystals formed by the interaction of aluminum or titanium and SiC.

To prevent surface flaws from forming, the fiber is provided with a thin surface coating of pure silicon. The phase diagram of Si-C-Al shows that aluminum carbide cannot occur in an excess of silicon at temperatures near the solidus of the aluminum alloy where aluminum matrix alloys are consolidated.

Although on occasion acceptable values of both axial strength and transverse strain can be achieved without the silicon coating, the coating provides far more tolerance to the normal variations encountered in compositing; the silicon coated fiber exhibits far more consistent good properties than the fiber without the silicon coating.

Process as in Disclosure

Figure 3:
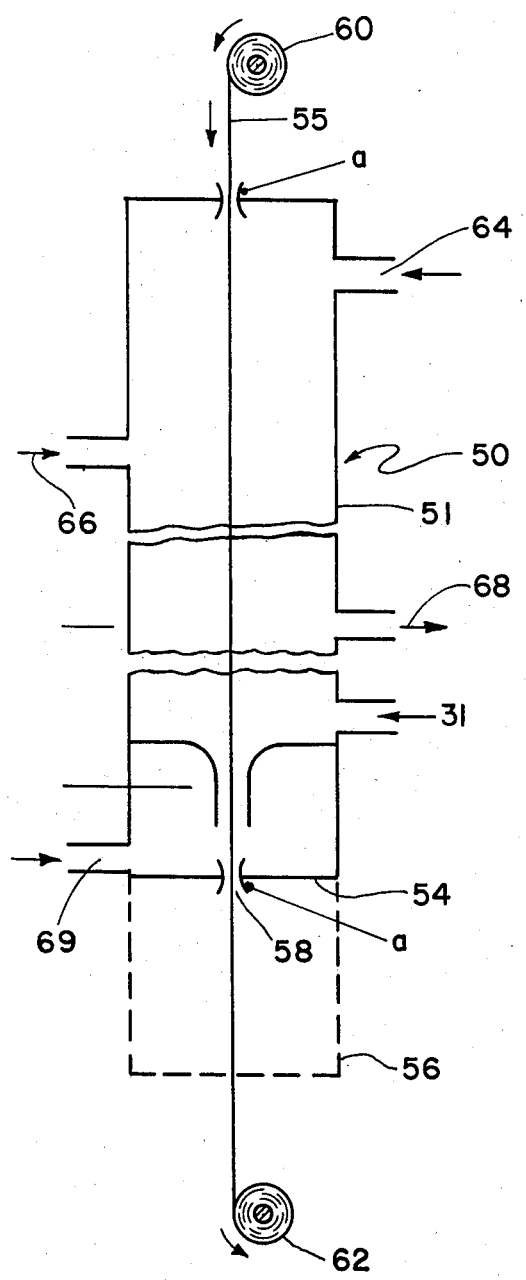
FIG. 3 is a schematic representation of a reactor for creating a fine grain layer between the bulk layer and the transition zone.

The process for making the fine grain structure and the transition zone is conducted in a fairly typical reactor such as the one illustrated in FIG. 3 and U.S. Pat. No. 4,340,636. The structure of the reactor is altered to accommodate the additional fine grain layer. Also as will be noted later, a second reactor (not illustrated) is used to deposit the pure silicon surface layer 30. It will be possible to add the surface layer deposition to an existing reactor for making SiC filament.

Referring to FIG. 3, there is shown a reactor 50 which is in the form of an elongated tube 51. As is typical, on the top and bottom of the reactor are electrodes a-a for applying a current from a convenient source of electricity to heat the monofilament 55 that traverses the reactor 50. In a conventional way, a core consisting of either carbon monofilament or tungsten monofilament is unwound from coil 55. The core passes through the top electrode "a" and leaves the reactor 50 from the bottom electrode "a" and is taken up on the spool 62. In the process of traversing the reactor, there is deposited on the core 15 SiC as well as other materials depending on the type of filament being constructed. As is described in U.S. Pat. No. 4,340,636, the bulk SiC filament contains a core on which an intermediate carbon-rich layer is deposited. A stoichiometric or bulk SiC layer is then deposited on the intermediate carbon-rich layer.

The intermediate layer is constructed in the reactor between the entrance ports 64 and 66 in a conventional way. The bulk SiC layer is formed between the entrance port 66 and the exit port 68 again in a conventional way as described in U.S. Pat. No. 4,340,636.

To form a fine grain stoichiometric SiC layer, it is necessary to decrease the deposition temperature of the filament. This is done by providing an excess of hydrogen. Hydrogen conducts heat better than the silanes. Because of the excess hydrogen, more heat is conducted away from the filament to the tube 51, and the filament cools.

It is also beneficial to reduce the hydrogen to silane ratio in order to produce a fine grain structure. The excess hydrogen and the reduced amount of silane is supplied to the reactor through the entrance port 31. The fine grain structure is formed between the entrance port 31 and the exit port 68.

Again in the manner described in U.S. Pat. No. 4,340,636, a propane and silane mixture is coupled to the reactor through the entrance port 69. As a result, the carbon-rich region 22 containing the transition regions 26 and 28 is formed between the entrance port 69 and the entrance port 31.

Following the construction of the intermediate carbon-rich layer, the bulk SiC layer, and fine grain, structure, the semi-finished filament containing all these layers is then coupled to another reactor (not illustrated). In this reactor, mixture of hydrogen and dichlorosilane is supplied. The dichlorosilane decomposes on the heated filament to deposit out pure silicon. It is clearly obvious that the second reactor may be added to the FIG. 3 reactor 50 as shown in dotted outline 56 to enable a practitioner to make the pure silicon filament, the fine grain layer, and the complete transition zone in one set of sequential steps.

The following examples demonstrate the benefits to composite mechanical properties from this invention.

| Fiber Type | Axial Ultimate Tensile Strength (ksi) | Transverse Strain to Failure (microinches/in.) |
|---|---|---|
| SCS-2 (typical values) | 225 ksi | 800–1000 |
| Fiber with Transition Zone, No Si coating | 185 | 2780 |
| Si Coated Fiber as described above | 225–235 | 9670 |

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims:

We claim:

1. An SiC monofilament for use in combination with a matrix material to form a composite material comprising:
    an SiC monofilament having a bulk SiC layer;
    a layer of fine grain SiC having a finer grain size than the grain size of the bulk SiC deposited on the bulk SiC; and
    a surface transition zone deposited on the fine grain SiC layer for interacting with the matrix.

2. A monofilament as described in claim 1 wherein the bulk SiC has a definitive crystal size, and said fine grain crystal size is one tenth of the crystal size of the bulk SiC.

3. A monofilament as described in claim 1 wherein the matrix material is aluminum, the surface transition zone comprises a carbon-rich region abutting the fine grain SiC layer, and an outermost region of pure silicon deposit.

4. A monofilament as described in claim 3 wherein the minimum silicon to carbon ratio is 0.2 to 0.5.

5. A monofilament as described in claim 1 wherein the surface transition zone is boron carbide.

6. A monofilament as describedin claim 5 wherein the thickness of the boron carbide surface transition zone is 7–10 microns.

7. A monofilament as described in claim 1 wherein the grain size of the bulk SiC is 500–1,000 nanometers, and the grain size of the fine grain SiC is 50–100 nanometers.

8. A monofilament as described in claim 1 wherein the-thickness of the carbon-rich region is less than 1 micron.

9. A monofilament as described in claim 8 wherein the thickness of the carbon-rich region is 0.4 to 0.5 micron.

10. A monofilament as described in claim 9 wherein the depth of pure silicon outermost region is 1 micron.

* * * * *